United States Patent [19]

Hayakawa et al.

[11] Patent Number: 4,720,617
[45] Date of Patent: Jan. 19, 1988

[54] APPARATUS FOR CONTINUOUS PROCESSING IN THE DIRECTIONS OF X- AND Y-COORDINATES

[75] Inventors: Futomi Hayakawa; Kazuo Onoda, both of Tokyo, Japan

[73] Assignee: Hy-Bec Corporation, Tokyo, Japan

[21] Appl. No.: 886,787

[22] Filed: Jul. 18, 1986

[30] Foreign Application Priority Data

Jul. 18, 1985 [JP] Japan .................................. 60-157056

[51] Int. Cl.$^4$ ................................................ B23K 1/04
[52] U.S. Cl. ............................ 219/85 BA; 219/85 R; 219/121 LC; 219/8 SF
[58] Field of Search .......... 219/85 BA, 85 BM, 85 R, 219/349, 85 F, 121 LC

[56] References Cited

U.S. PATENT DOCUMENTS

| | | | |
|---|---|---|---|
| 2,318,533 | 5/1943 | Selvig | 219/349 X |
| 3,283,124 | 11/1966 | Kawecki | 219/85 BA X |
| 3,486,004 | 12/1969 | Morrone | 219/85 BA X |
| 3,520,055 | 7/1970 | Jannett | 219/121 LC X |
| 3,522,407 | 8/1970 | Costello | 219/85 BA |
| 3,586,813 | 6/1971 | Cruickshank | 219/85 BA |
| 3,683,146 | 8/1972 | Nugent et al. | 219/349 X |
| 3,763,348 | 10/1973 | Costello | 219/349 |
| 4,575,608 | 3/1986 | Wictorin et al. | 219/85 BM |

FOREIGN PATENT DOCUMENTS 635733 2/1963 Belgium .............................. 219/85 F

*Primary Examiner*—E. A. Goldberg
*Assistant Examiner*—C. M. Sigda
*Attorney, Agent, or Firm*—Young & Thompson

[57] ABSTRACT

An apparatus for the continuous processing of a work piece, such as an IC-chip or an LSI-chip, in the directions of the x- and y-coordinates, which comprises a pair of heat ray sources arranged on a heat ray source assembly for irradiating a corresponding pair of parallel processing lines extending in the direction of the x-coordinate, by focussing heat rays onto each of the processing lines in the shape of a straight line. A cylinder/piston arrangement effects vertical positioning of the pair of heat ray sources for adjusting the focussing of heat rays onto the processing line. A turning mechanism turns the heat ray source assembly through 90° so as to align the pair of line foci with a pair of parallel processing lines extending in the direction of the y-coordinate. There is a distance adjustment for adjusting the distance between the pair of parallel line foci by effecting a parallel relative shifting of the pair of heat ray sources. A masking element for each heat ray source has a pair of shield members for limiting the width of the heat ray beam discharged from the heat ray source, to determine the length of the line focus for each operation in the x- or y-direction. A masking element actuator is provided for each pair of heat ray sources and comprises a pair of cylinder/piston units for effecting simultaneous relative shifting of the pair of shield members to limit the width of the heat ray beam and thus to define the length of the line focus.

12 Claims, 14 Drawing Figures

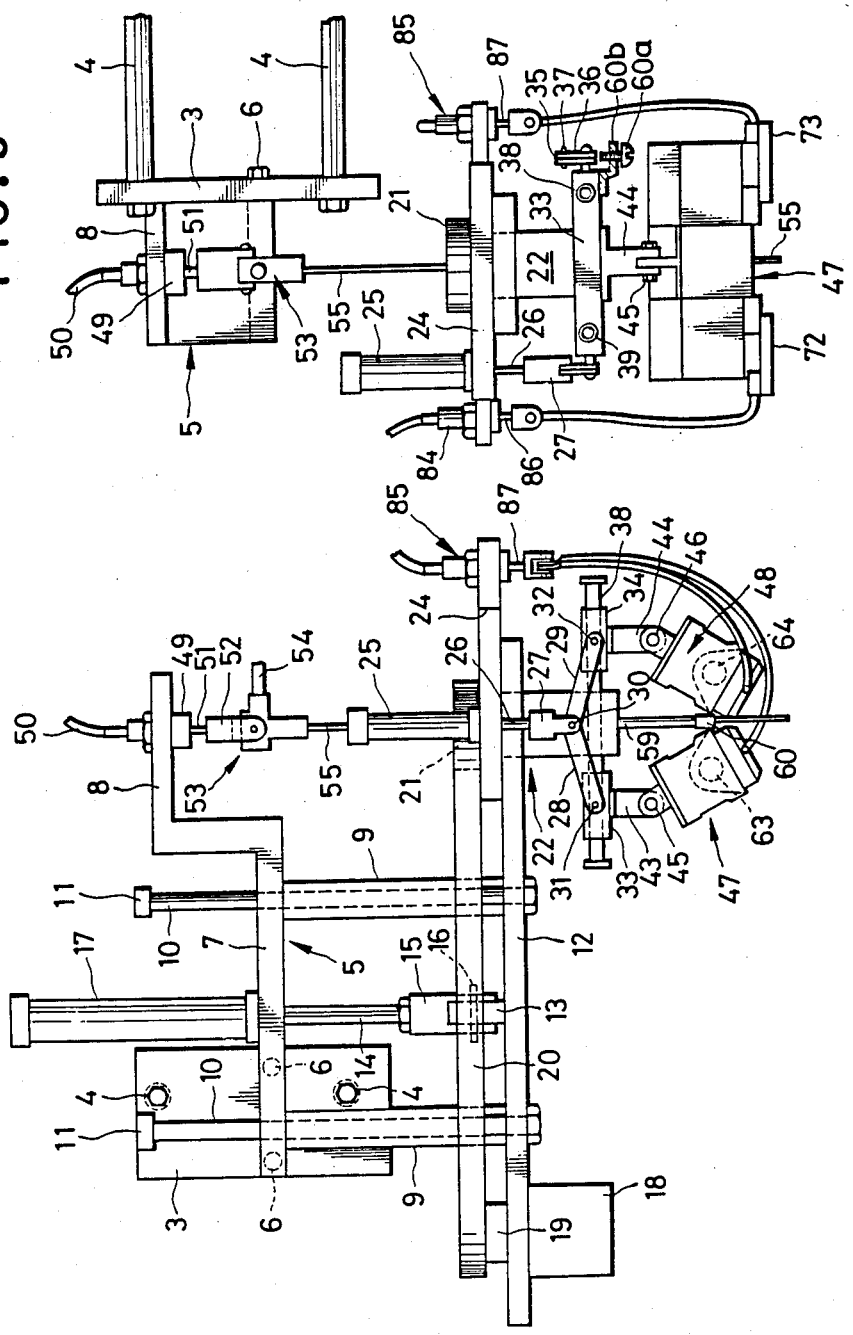

APPARATUS FOR CONTINUOUS PROCESSING IN THE DIRECTIONS OF X- AND Y-COORDINATES

BACKGROUND OF THE INVENTION

The present invention relates to an apparatus for continuous processing in the directions of x- and y-coordinates, suitably especially for soldering a work piece such as a semiconductor device, for example and IC-chip, an LSI-chip or the like, on a substrate plate, wherein the distance between a pair of parallel linear sections to be processed (processing lines) and the length of the processing line are different in the directions of the x- and y-coordinates.

For soldering terminal pins of semiconductor devices, such as IC-chips and LSI-chips, to those of a substrate, there have been in practical use non-contact type apparatuses, in which a laser beam transmitted through a flexible light conducting filament (optical fiber) is employed to provide spot irradiation at the soldering site to attain soldering of each lead pin of the semiconductor chip with a corresponding pin of the substrate, and contact-type apparatuses, in which the soldering is effected by the use of a soldering iron directly contacting the soldering spot.

The non-contact type soldering apparatuses are costly, since high price optical elements and devices are required, such as optical fibers, etc. The irradiation of the soldering spot by a laser beam may sometimes accidentally burn the substrate or destroy the semiconductor chip during the processing operation by the high temperature resulting from the laser beam.

A non-contact type soldering apparatus may sometimes produce a defective connection at the processed site, because of the flux material, contaminants adhering to the soldering iron, and so on, so that it is necessary to remove the contaminants and to polish the soldering iron tip at frequent intervals. In particular, it has been necessary to change or replace the soldering iron tip in accordance with the alteration of the type and form of the semiconductor chip to be processed. This makes it necessary to stock various types of soldering iron tip. In addition, in the case of contact type apparatuses, a continuous processing in the directions of the x- and y-coordinates is not possible, when the distance between the processing lines or the length thereof is different in the directions of x- and y-coordinates, since it is necessary to let the iron tip contact each processing site.

The inventors have conducted extensive research to develop an apparatus capable of realizing a high processing performance without connection failure in an economical manner, taking into account the fact that non-contact type soldering produces cleaner work with higher efficiency than contact-type soldering; and in this way the inventors have reached the present invention.

OBJECTS OF THE INVENTION

An object of the present invention is to provide an apparatus for the continuous processing of a work piece which permits continuous and successive soldering in both the directions of the x- and y-coordinates, even when the distance between a pair of parallel processing lines and the length thereof are different in the directions of the x- and y-coordinates.

Another object of the invention is to provide an apparatus for the continuous processing in the directions of the x- and y-coordinates, in which the heat ray beam is concentrated or focussed onto the processing line in an elongated focal region (denoted hereinafter as line focus) and in the form of a segment of a line having a length corresponding to that of the processing line, so that no extraneous heat ray will irradiate any portion other than the processing line.

A further object of the invention is to provide an apparatus for the continuous processing of a work piece in the directions of the x- and y-coordinates, in which the distance between a pair of line foci of heat ray beams irradiating the corresponding pair of processing lines, in the direction of the y-coordinate, and the length of the line focus are automatically adjusted during the time interval after the completion of the processing in the direction of the x-coordinates until the commencement of the processing in the direction of the y-coordinate, whereby the total processing time for one complete cycle of processing effected in both the directions of the x- and y-coordinates can be decreased.

In the apparatus according to the present invention, a pair of heat ray sources are provided for irradiating simultaneously the processing lines of varying length extending parallel either in the direction of the x- or y-coordinate on the work piece, such as an IC-chip or an LSI-chip placed on a substrate, at a variable distance with each other.

The pair of heat ray sources are part of a heat ray source assembly which is arranged so as to permit 90° turning, in order that the processing, for example, soldering, of the processing lines extending in the direction of the x-coordinate be followed automatically by the processing in the direction of the y-coordinate. Thus, the soldering of a pair of processing lines in the direction of the x-coordinate is first carried out by a pair of heat ray beams, each of which is focussed onto the processing line, namely, a length of soldering line in which a row of terminal lead pins of a semiconductor chip and a row of corresponding terminal lead pins on the substrate plate are aligned, and thereafter the soldering of a pair of processing lines in the direction of the y-coordinate is effected by turning the heat ray source assembly at an angle of 90°. In order that the distance between the pair of line foci and the distance between the pair of processing lines will be the same, not only in the direction of the x-coordinate but also in the direction of the y-coordinate, said pair of heat ray sources are subjected to a parallel shifting while maintaining a constant orientation toward each of the processing lines, namely a constant angle of direction toward the processing line. On the other hand, the adjustment of the length of the line focus irradiating the processing line for the processing in the x-direction and for the processing in the y-direction is attained in such a manner, that a pair of shield members are disposed on each heat ray discharge opening of the heat ray source so as to permit an automatic sliding movement of both the members. Thus, even when the work piece to be processed has different processing lengths in the x- and y-directions, an automatic adjustment of the line focus not only as to the distance between the pair of line foci but also as to the length of each line focus can be attained. Therefore, no limitation is imposed on the size and type of work piece, and a reduction in the total processing time required for one complete cycle of processing including processing steps performed in the x- and y-directions is achieved, so that the work efficiency is improved markedly. By automatically performing first the processing step in the x-direction and then the step in the y-direction, by turning the heat ray source assembly at a right angle, the work piece once placed on the work table in the proper position can be processed automatically both in the x- and in the y-directions in a continuous manner.

In the following, the invention will be further described by way of one concrete embodiment as represented in the appended drawings.

BRIEF DESCRIPTION OF THE DRAWINGS

FIG. 2 shows an embodiment of the apparatus according to the invention in a front view;

FIG. 3 is a side view of the apparatus of FIG. 2;

DETAILED DESCRIPTION OF THE INVENTION

In the appended drawings, a particular embodiment of the apparatus according to the present invention is exemplified. But it is to be understood that the present invention is not, in any sense, restricted to the embodiment represented.

Figure 1:
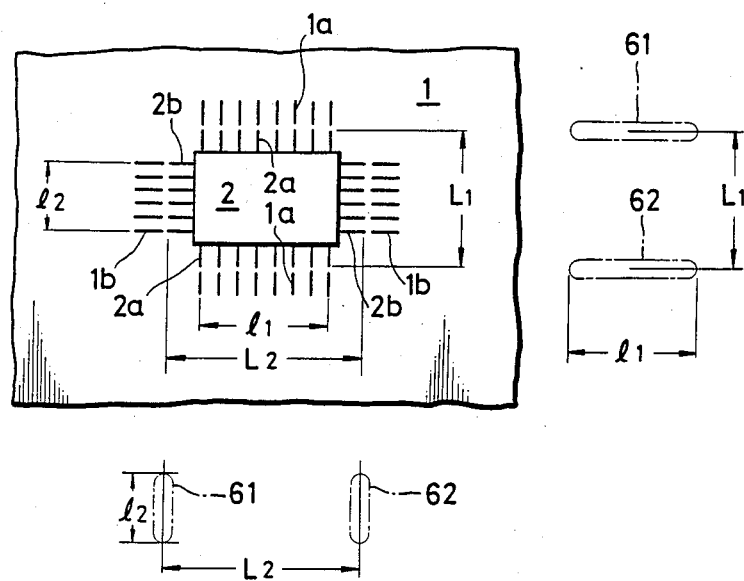
FIG. 1 is an exemplary representation of an arrangement of an IC-chip on a substrate for processing by soldering, in a schematic plan view.
Figure 4:
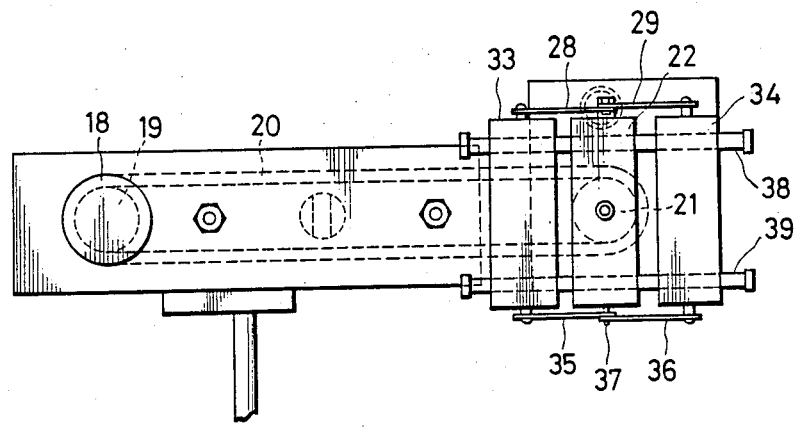
FIG. 4 is the underside plan of the apparatus of FIG. 2.

FIG. 1 shows schematically an arrangement of a semiconductor device 2, such as an IC- or LSI-chip, on a substrate for processing by soldering, in a plan view. The semiconductor chip 2 is provided around its periphery with a number of terminal lead ins 2a, 2b in alignment with the corresponding terminal lead pins 1a, 1b of the substrate plate 1. The work piece held in this arrangement is supported on a work table (not shown). The relationship between the distance $L_1$ between the two parallel processing lines extending in the direction of the x-coordinate and the distance $L_2$ between the two parallel processing lines extending in the direction of the y-coordinate is $L_1 < L_2$ in the embodiment of FIG. 1. Thus, a pair of processing lines in the direction of the x-coordinate are irradiated by a corresponding pair of heat ray beams focussed each onto the corresponding processing line as a line focus having a length of $l_1$ at a distance $L_1$ from each other. In a similar way, the processing in the direction of the y-coordinate is performed by a pair of heat ray beams focussed onto the corresponding pair of processing lines extending in the y-direction as line foci having a length $l_2$ corresponding to the length of the processing line and having a distance $L_2$ from each other. An embodiment of an apparatus capable of performing the processing in this manner will be explained below.

FIG. 2 shows an embodiment of the apparatus according to the present invention in a front view. The apparatus has a vertical support 3 fixed to the apparatus by fixing bolts 4, 4. On one side (left side in FIG. 3) of the vertical support 3, a bracket 5 is secured by screw bolts 6, 6. The bracket 5 has a longer supporting part 7 and a shorter supporting part 8. On the underside of the longer supporting part 7 are fixed guide sleeves 9, 9 by, for example, screwing their upper ends thereinto. Inside each of the guide sleeves is inserted a guide rod 10 so as to be vertically movable. Each guide rod 10 has a stopper 11 at its upper end. The guide rods 10 are held at the lower ends thereof on a holder table 12. A connection lug 13 on the upper face of the holder table 12 connects table 12 with a piston rod 14 of a cylinder/piston arrangement 17 by a split shank 15 with a connection pin 16. The piston rod 14 is moved vertically by the cylinder/piston arrangement 17 operated by a source of hydraulic or pneumatic pressure (not shown).

The holder table 12 carries a driving means 18 consisting of, for example, a rotary air motor. The driving movement of the driving means 18 is transmitted to a rotatable shaft 22 by a belt/pulley transmission means (19, 20, 21). The rotatable shaft 22 is held rotatably inserted in a bearing hole 23 in the holder table 12. The rotatable shaft 22 is provided at its upper end with an upper supporting plate 24 on which is mounted a cylinder/piston actuator 25 operated by a source (not shown) of hydraulic or pneumatic pressure for effecting the adjustment of the distance of the pair of line foci falling on the corresponding pair of process lines. The piston rod 26 of the cylinder/piston actuator 25 is connected to a connection member 27 which is connected to a link connection consisting of two lines 28, 29 and a connection pin 30. Each of the lines 28, 29 is connected at its other end to a respective one of a pair of slide members 33, 34 by a pivot joint 31, 32. The pair of slide members 33, 34 are further connected with each other on their other side by a link connection consisting of two links 35, 36 and a connection pin 37. The pair of slide members 33, 34 are slidably guided at their end portions on a pair of guide rods 38, 39. The pair of guide rods 38, 39 are disposed fixedly in a parallel arrangement in holes 41, 42 through a lower supporting plate 40 arranged at the lower end of the rotatable shaft 22. Each of the pair of slide members 33, 34 is provided on its underside with an arm 43, 44. The arms 43, 44 carry each a heat ray source 47, 48 through a pivot joint 45, 46.

The shorter supporting part 8 of the bracket 5 carries a cylinder/piston unit 49 operated hydraulically or pneumatically which is connected to, for example, a compressed air source (not shown) via a pipe 50. The piston rod 51 thereof is connected to a junction member 53 by a connection plate 52. The junction member 53 is connected on one side to an air pipe 54 through which, for example, cooling air from a cooling air source (not shown) is supplied. To the junction member 53 is further connected the upper end of a tube 55. The tube 55 is constituted of, for example, a metal tube and extends through a hole 56 at the center of the rotatable shaft 22 and is freely slidable therein up to a position near the work piece. The lower end 57 of the tube 55 opens freely to allow discharge of the cooling air. It is possible to provide multiple sits around the tube end periphery in a uniform circumferential distribution so as to effect a uniform discharge of the cooling air around the tube end.

Figure 5:
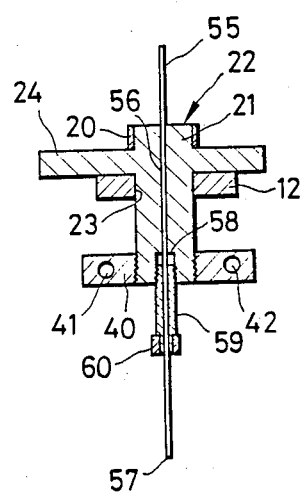
FIG. 5 is a vertical section through the rotatable shaft of the heat ray source assembly of the apparatus of FIG. 2.
Figure 6:
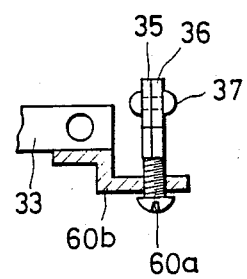
FIG. 6 illustrates one end portion of the slide member of the heat ray source assembly in an enlarged vertical section.
Figure 7:
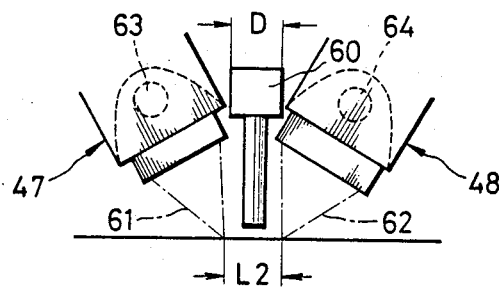
FIG. 7(A) shows schematically the focussing of the heat ray beams onto the soldering lines.
FIG. 7(B) is a diagram of the relationship between the minimum distance between the pair of line foci and the outer diameter of the centering collar determining it.
Figure 7:
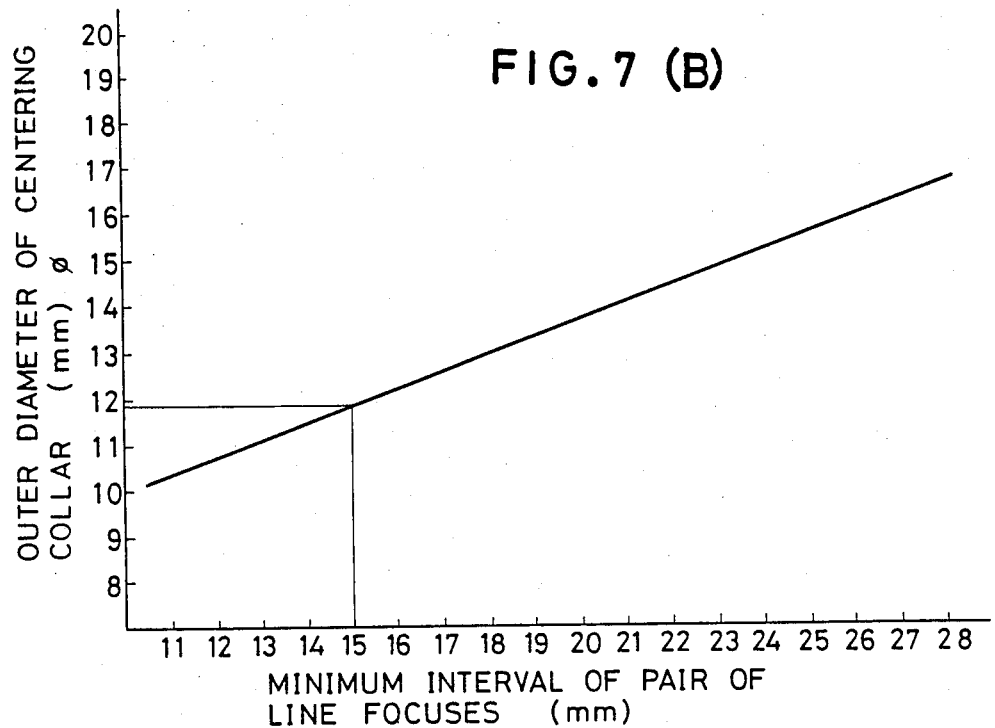

The rotatable shaft 22 has at its lower end a threaded hole 58 (see FIG. 5) in which a guide tube 59 is inserted by screwing therein. The tube 55 passes freely movably through the guide tube 59. At the lower end of the guide tube 59, a centering collar 60 is attached removably which serves to set the minimum distance between the pair of line foci of heat ray beams 61, 62 emitted from the heat ray lamps 63, 64 of the pair of heat ray sources 47, 48. Therefore, various sizes of centering collars 60 having varying outer diameters are kept in stock for optional use in accordance with each particular processing operation. Thus, in a practical application of the apparatus according to the present invention, the distance between the pair of line foci of the heat ray beams is first made to coincide with the distance $L_1$ between the pair of processing lines in the direction of the x-coordinate, and a suitable centering collar 60 can easily be chosen by reading the correlation diagram given in FIG. 7(B). Thus, for example, if the distance $L_1$ between the pair of processing lines is assumed to be 15 mm, a suitable centering collar 60 should have an outer diameter $\phi$ of 11.8 mm. In order to set the distance $L_2$ between the pair of processing lines in the direction of the y-coordinate, the angle of the heat ray source to the processing line is adjusted by an adjusting screw $60a$ arranged so as to permit an adjustment of the travelling stroke of the screw in a support member $60b$ arranged on the lower supporting plate 40. The adjusting screw $60a$ is positioned directly under the connection pin 37 connecting the links 35 and 36 (see FIG. 6). The lower edge of the links 35, 36 will abut the top of the adjusting screw $60a$ and thus limit the horizontal mutual shifting of the pair of slide members 33, 34 thereby to limit the maximum interval of the pair of heat ray sources 47, 48, so that the distance between the pair of line foci of the heat ray beams can be set to coincide with the distance $L_2$ between the pair of processing lines of the y-direction.

Figure 8:
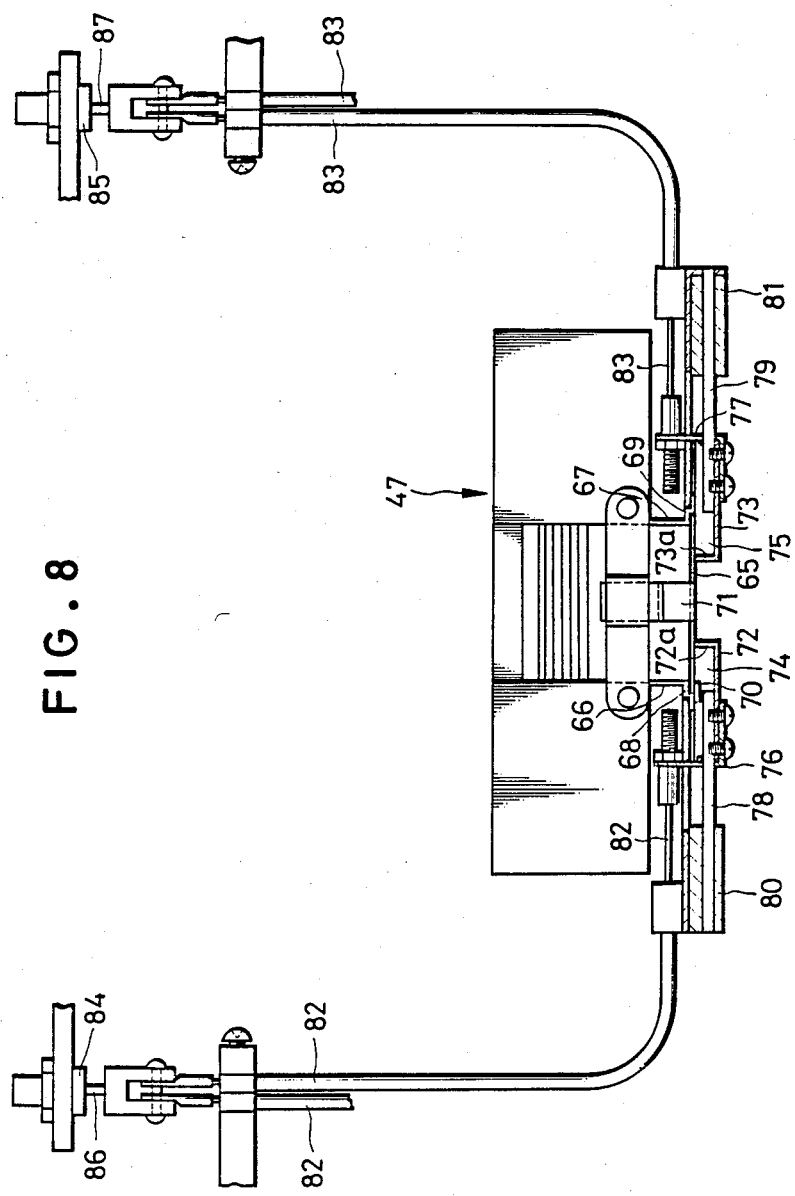
FIG. 8 illustrates the structure of the masking mechanism for the heat ray irradiation.
Figure 9:
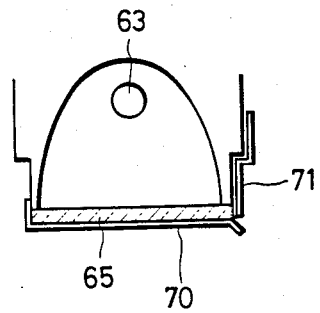
FIG. 9 is a sectional view of the heat ray source.

The heat ray sources 47, 48 are provided each with a heat ray lamp 63, 64 and a glass cover plate 65 made of a heat resistant glass, such as quartz glass, Pyrex (trade name) or so on, over its heat ray discharging opening (see FIGS. 8 and 9). The heat resistant glass plate 65 is inserted removably along the receptacle part 68, 69 formed at the lower end of the reflecting side plates 66, 67 of the heat ray source by ending a portion thereof. The glass plate is supported on a supporting frame 70 extending over the entire width of the glass plate 65 on the underside of one of the two receptacle parts 68.

Figure 11:
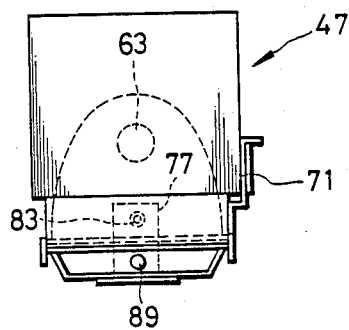
FIG. 11 is a side view of the heat ray source.

The end portion on the entrance side of the supporting frame 70 is bent downward a little, in order to facilitate the insertion of the glass plate 65 (see FIG. 9). In order to hold in the glass plate 65 so inserted, it is retained by a vertically slidable stopper 71 (see FIG. 11) disposed on the heat ray source body. Since the structure of the heat ray source is the same for both the sources 47 and 48, the explanation thereof is directed hereinafter only to the heat ray source 47.

Figure 10:
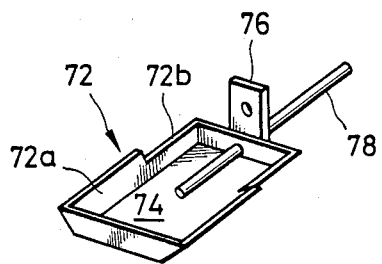
FIG. 10 is a perspective view of the shield member.
Figure 12:
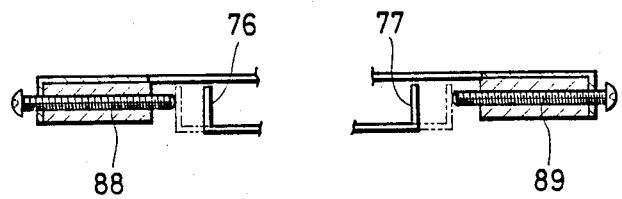
FIG. 12 is a partial section of the masking element showing the manner of adjustment of the masking width.
Figure 13:
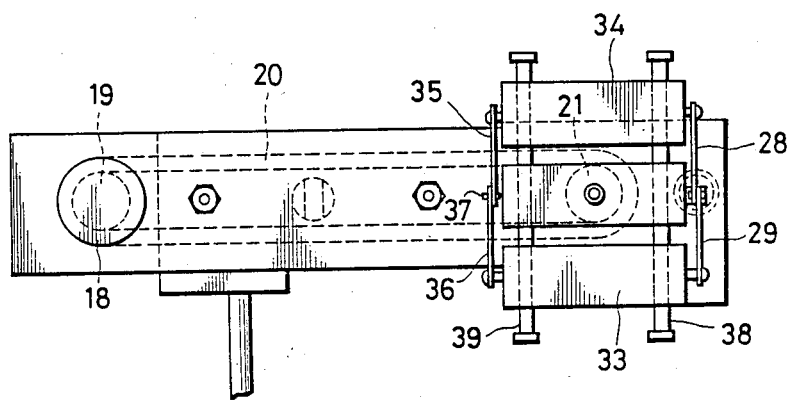
FIG. 13 is an underside plan of the apparatus of FIG. 2 in which the heat ray source assembly has been turned 90° by the turning element.

In order to limit the longitudinal extent of the heat ray beams and thus to limit the length of the line focus, the heat ray source is provided with a masking element consisting essentially of a pair of shield members 72, 73 disposed on and slidable along the outer face of the heat resistant glass plate 65 (see FIG. 8). Each heat ray source has a pair of shield members 72, 73 each of which has peripheral raised edges $72a$, $73a$ surrounding it to form a heat ray shield space 74, 75. A part of the surrounding edges $72a$ is cut off ($72b$) so as to facilitate venting heat accumulated within the heat ray source. The longitudinal edges are inclined (see FIG. 10), in order to prevent substantial contact of the surrounding edges $72a$, $73a$ with the tube 55, even if the pair of heat ray sources 47, 48 are positioned close to the minimum distance from each other (see FIG. 2). Each of the pair of shield members 72, 73 is provided with a stop 76, 77 (FIGS. 8, 10). Through this stop 76, 77, a guide bar 78, 79 is inserted. The guide bar 78, 70 passes slidably through a fixed plate 80, 81. The stop 76, 77 is coupled to a flexible actuation transmission wire 82, 83 which is connected at its other end to a piston rod 86, 87 of a pneumatic cylinder/piston unit 84, 85. The cylinder/piston unit 84 is associated with the shield member 72 and the cylinder/piston unit 85 is associated with the shield member 73 (see FIG. 3). Each shield member is further provided with an abutment screw 88, 89 (see FIG. 12) which serves for limiting the shifting movement of the shield member 72, 73 by abutting there against.

If the travelling stroke of the abutment screws 88, 89 is chosen to be small, the amount of shift of the pair of shield members 72, 73 becomes large and, thus, a longer line focus of the heat ray beam is attained, so that a longer processing length $l_2$ in the direction of the x-coordinate can be achieved in a simple manner. In a similar way, a shorter processing length $l_2$ in the direction of the y-coordinate can be achieved by setting the travelling stroke of the abutment screw at a correspondingly greater value.

The manner of operation of the apparatus according to the present invention is as follows:

Each row of the terminal lead pins $2a$, $2b$ of the semiconductor chip 2 is aligned with the corresponding row of terminal lead pins $7a$, $1b$ on the substrate plate 1 so as to align each terminal lead pin of the semiconductor chip with the corresponding terminal lead pin of the substrate. Then, the distance between the pair of line foci of the heat ray beams and the length of the line focus is adjusted so as to coincide with those ($L_1$, $l_1$ and $L_2$, $l_2$) of the pair of processing lines. If, for example, the distance between the pair of processing lines in the direction of the x-coordinate $L_1$ is assumed to be 19 mm, a centering collar 60 having an outer diameter of 13.5 mm $\phi$ should be chosen, as can be seen from the correlation diagram of FIG. 7. This centering collar 60 is mounted on the guide tube 59 at its lower end. Each of the pair of heat ray sources 47, 48 is tilted around the pivot joint 45 or 46, until the side edge of the heat ray source abuts the side face of the centering collar 60. In this manner, the distance between the pair of parallel line foci of the heat ray beams 61, 62 emitted from the pair of heat ray sources 47, 48 will coincide with the distance $L_1$ between the pair of parallel processing lines in the direction of the x-coordinate. In order thereafter to adjust the length of the line focus so as to coincide with the processing length $l_1$ of the x-direction, the travelling stroke of the stopper screw 88, 89 is settled correspondingly to determine the amount of shifting of the shield members 72, 73.

For adjusting the distance between the pair of line foci so as to coincide with the distance $L_2$ between the pair of processing lines of the y-direction, the travelling stroke of the adjusting screw 70a is correspondingly set to adjust the position of contact with the links 35, 36, in order to limit correspondingly the articulated spreading movement of the links 28, 29 thereby to attain coincidence of the distance between the pair of line foci of the heat ray beams 61, 62 with said distance $L_2$ between said pair of processing lines.

Likewise, for attaining adjustment of the processing length $l_2$ in the direction of the y-coordinate, the travelling stroke of the abutment screw 88, 89 is settled correspondingly so as to achieve a suitable adjustment of the width of the heat ray discharge opening thereby to achieve a suitable length of the line focus corresponding to the requisite processing length $l_1$ in the direction of the y-coordinate.

When carrying out the soldering of a semiconductor chip onto a substrate, the pneumatic cylinder/piston unit 49 is operated to let descend the tube 55 until the lower end thereof touches the semiconductor chip 2 at the center thereof to pressingly arrest the work piece in a suitable condition. Then the cylinder/piston arrangement 17 is actuated so as to cause the piston rod 14 to descend to lower the heat ray source assembly to a position in which the heat ray beams 61, 62 from the heat ray lamp 63, 64 will be focused on the pair of parallel processing lines extending in the direction of the x-coordinate with a processing length $l_1$ and in distance $L_1$ between them, in a pair of line foci having a corresponding length and a corresponding distance between them. The soldering is effected by irradiating the processing lines with said pair of heat ray beams focussed onto them.

At the end of the processing in the direction of the x-coordinate, cooling air is blown through the tube 55 onto the upper face of the work piece. At the same time, the holder table 20 is elevated by actuating the cylinder/piston arrangement 17, and then the heat ray source assembly is turned by 90° by operating the turning element. Thus, the driving means 18 is energized to rotate the pulley means 19, 21 via the belt 20 to cause turning of the assembly through 90°.

In order to adjust the distance between the pair of line foci so as to coincide with the distance $L_2$ between the pair of processing lines, the cylinder/piston actuator 25 is energized to cause the piston rod 26 to protrude so as to slide the slide members 33, 34 on the guide rods 38, 39 through the links 28, 29 to effect a parallel shifting of the slide members in the direction away from each other. This spreading movement is limited by abutment of the links 28, 29 on the adjusting screw 60a, whereby a distance between the pair of line foci corresponding to the distance $L_2$ between the pair of processing lines is set.

In o-rder to adjust the processing length $l_2$, the cylinder/piston units 84, 85 disposed on the upper supporting plate are actuated, so as to cause simultaneous sliding of the shield members 72, 73 toward each other, whereby a length of the line focus corresponding to that of the processing line in the direction of the y-coordinate is achieved. The above-described movement of each part of the apparatus is started upon completion of the processing operation in the direction of the x-coordinate at the same time the heat ray source assembly begins to rise and is finished by the time the processing operation in the direction of the y-coordinate begins.

After the heat ray source assembly has been set for the processing of the y-direction, the heat ray source assembly is caused to descend by the cylinder/piston arrangement 17 in the same manner as explained above to irradiate the pair of processing lines by focussing the heat ray beams thereonto to effect instantaneous soldering. Thereafter, the blowing of the cooling air from the tube 55 onto the work piece and the lifting of the heat ray source assembly are accomplished in the same manner as explained above. The supply of cooling air is then stopped and the tube 55 is lifted by the action of the pneumatic cylinder/piston unit 49. In this manner, one complete cycle of the processing operation inclusive of processing steps in the x- and y-directions is completed.

It is of course possible to employ the apparatus only for the processing in only one direction, namely, in the x- or y-coordinate.

What is claimed is:

1. An apparatus for continuous processing of a work piece in the directions of the x- and y-coordinates, comprising a pair of heat ray sources mounted in a heat ray source assembly for irradiating a corresponding pair of parallel processing lines extending in the direction of the x-coordinate, by focussing a heat ray onto each of said processing lines in a straight line focus having the form of a segment of a line, means for effecting vertical positioning of said pair of heat ray sources for adjusting the focussing of heat rays onto said processing line, a turning mechanism for turning said heat ray source assembly through 90° so as to align said pair of line foci with a pair of parallel processing lines extending in the direction of the y-coordinate, distance adjusting means for adjusting the distance between said pair of parallel line foci by effecting a parallel relative shifting of said pair of heat ray sources, a masking element for each heat ray source and having a pair of shield members for limiting the width of the heat ray beam discharged from the heat ray source to determine the length of line foucs for each processing in the x- or y-direction, and masking element actuating means for each of said pair of heat ray sources and comprising means for effecting simultaneous relative shifting of said pair of shield members to limit the width of the heat ray beam and thus to define the length of the line focus.

2. An apparatus according to claim 1, wherein said means for effecting vertical positioning comprises a cylinder/piston arrangement.

3. An apparatus according to claim 1, wherein said means for effecting simultaneous relative shifting comprises a pair of cylinder/piston units.

4. An apparatus according to claim 1, wherein the pair of heat ray sources have each a heat ray lamp and are constructed each so as to permit adjustment of the angle at which they direct heat to a said processing line by pivoting the heat ray source.

5. An apparatus according to claim 1, wherein the heat ray sources are supported on a holder table so as to permit turning them through 90° by the turning mechanism, the holder table being so constructed as to allow displacement in elevation by means of a cylinder/piston arrangement.

6. An apparatus according to claim 1, wherein the heat ray source assembly has a rotatable shaft associated wit the turning mechanism, said shaft being supported rotatably in a bearing hole formed in a holder table and connected with said turning mechanism by pulley means on said shaft connected via a belt member to a driving means arranged on the holder table.

7. An apparatus according to claim 6, wherein the heat ray source assembly has at a lower end of the rotatable shaft a lower support plate supporting a pair of parallel guide rods for guiding on each a pair of sliding members, to adjust the distance between the pair of parallel line foci in such a manner that the pair of sliding members are connected to a cylinder/piston actuator via a link connection to effect relative sliding movement of the sliding members on the guide rods and to the pair of heat ray sources via a rigid coupling for adjusting the angle of the heat ray sources to the processing line.

8. An apparatus according to claim 7, wherein the pair of sliding members are connected with each other by a further link connection, the articular movement of which is limited by a stop consisting of an adjusting screw disposed on said lower supporting plate.

9. An apparatus according to claim 1, wherein each of the pair of shield members of the masking element is connected to said means for effecting simultaneous relative shifting via a flexible actuation transmission wire and slidingly guided on a guide bar along a heat ray discharge opening of the heat ray source and has the shape of a substantially rectangular dish surrounded by raised peripheral edges, of which a pair of longitudinal edges have a partially cut away portion to facilitate venting heat from the heat ray source.

10. An apparatus according to claim 9, wherein the raised edges of the pair of sheield members are inclined.

11. An apparatus according to claim 1, wherein the pair of heat ray sources are provided each at its heat ray discharge opening with a heat-resistant cover glass plate which is guided and sustained on an arresting member fixed on a reflecting side plate of the heat ray source and has a portion bent downward at the entrance end thereof and is retained by a vertically slidable stopper disposed on the heat ray source body.

12. An apparatus according to claim 1, wherein a stop is fixedly disposed on each shield member of the masking element and serves to effect limitation of sliding movement of the shield member by abutting an adjustable abutment screw.

* * * * *